United States Patent [19]
Hempstead et al.

[11] 4,103,315
[45] Jul. 25, 1978

[54] ANTIFERROMAGNETIC-FERROMAGNETIC EXCHANGE BIAS FILMS

[75] Inventors: Robert Douglas Hempstead, Morgan Hill, Calif.; Sol Krongelb, Katonah, N.Y.; Daniel Andrew Nepela, Saratoga, Calif.; David Allen Thompson, Somers, N.Y.; Erich Philipp Valstyn, Los Gatos, Calif.

[73] Assignee: International Business Machines Corporation, Armonk, N.Y.

[21] Appl. No.: 809,598

[22] Filed: Jun. 24, 1977

[51] Int. Cl.² .................... G11B 5/12; G11B 5/30
[52] U.S. Cl. .................... 360/110; 360/113; 360/127; 427/131; 427/47; 428/900; 428/928
[58] Field of Search ............. 360/110, 113, 127, 123; 427/131, 47, 48; 428/928, 611, 632, 472, 900; 29/603

[56] References Cited
U.S. PATENT DOCUMENTS

| 3,717,504 | 2/1973 | Aonuma et al. | 428/928 |
| 3,840,898 | 10/1974 | Bajorek et al. | 360/113 |

*Primary Examiner*—Robert S. Tupper
*Attorney, Agent, or Firm*—Graham S. Jones, II

[57] ABSTRACT

In thin film magnetic transducers, e.g., inductive or magnetoresistive recording heads, at least a pair of layers of a ferromagnetic material and an antiferromagnetic material are deposited upon one another and exchange coupled to retain a unidirectional bias in the plane of the ferromagnetic material. When multiple pairs of layers are used, they are separated by layers of nonmagnetic material. In some cases, successive pairs of layers of material with unidirectional bias have their directions of bias pointing in opposite directions. The domain walls in the layers of material are minimized by this technique.

53 Claims, 22 Drawing Figures

ANTIFERROMAGNETIC-FERROMAGNETIC EXCHANGE BIAS FILMS

BACKGROUND OF THE INVENTION

1. Field of the Invention

This invention relates to magnetic recording heads for reading and writing magnetic signals and, more particularly, to thin film magnetic transducers employing high permeability magnetic films for pole pieces, magnetic shields, etc. This invention also relates to any thin film magnetic transducers such as transformers, etc.

2. Prior Art

Thin film magnetic recording devices of small physical size, as reviewed, for example by Chynoweth and Kaiser, AIP Conference Proceedings 24, p. 534–540 (1974) and by Thompson, AIP Conference Proceedings 24, p. 528–533 (1974, show the effect of individual magnetic domains in response to electrical and magnetic excitation. The strength of the magnetic field required to force a magnetic film of a predetermined thickness to comprise a single magnetic domain increases approximately inversely as the linear dimensions of a structure are decreased. The latter is a demagnetizing effect which insures that an isolated magnetic film of a few hundred microns in diameter or less will contain several domains if it has a thickness of a few microns or less. When a bias field sufficiently strong to saturate the material into a single magnetic domain is applied to a film, the result is that the effective permeability is reduced to a uselessly low value. One way to overcome the problem of low effective permeability would be to make a multilayer structure of thin films if one were able to alternate the direction of the bias field from one layer to the next, since then a much smaller magnitude of bias field would be required. However, heretofore, there has been no way available or known for the purpose of producing a multiple layer thin film structure with alternating directions of bias of the thin films.

It has been known that deposition of a sandwich of Mn and NiFe layers with one layer each can sustain a magnetic bias field in the Ni-Fe film by annealing in a magnetic field at a temperature of 300° C, Salanski et al, "Stabilization of Microdomain Configurations in Two-Layer Magnetic Films," Sov. Phys.-JETP, Vol. 38, No. 5, May 1974, p. 1011 et seq. A U.S. Pat. No. 3,840,898 of Bajorek et al for a "Self-Biased Magnetoresistive Sensor" teaches that a hard magnetic bias can be provided by exchange coupling between two layers if there is direct atomic contact between the layers in a magnetic recording magnetoresistive sensor. An antiferromagnetic material such as $\alpha Fe_2O_3$ is deposited on a glass substrate followed by deposition of Ni-Fe by evaporation in a strong magnetic field to produce a magnetically hard composite film having a permeability of 20 or less. Glazer et al in "Stabilization of the Ferromagnetic Domain Structure in Thin Films with Exchange Anisotropy, "Phys. Metals and Metallography (USSR) 26 #2, pp. 103–110 (1968) teaches stabilization of 1,000 Angstrom thick 82:18, Ni:Fe films with a 1,000 Angstrom thick manganese layer below it as the films cool through the Neel temperature following "spraying" onto a substrate. The film was demagnetized and then annealed for 1½ hours at 350° C. The exchange coupling leads to stabilization of the domain structure.

Glazer et al in "Exchange Anisotropy in Thin Magnetic Films," Soviet Physics-Solid State, Vol. 8, No. 10, pp. 2413–2420 discuss vacuum deposition of a 450 Angstrom thick manganese layer, followed by 800 Angstrom thick Ni:Fe – 82:18 layer which had uniaxial anisotropy following deposition. It was annealed in a magnetic field of 140 Oe along the easy axis at 350° C for 30 min. and cooled to room temperature in the furnace with the magnetic field still applied. The purpose of annealing was to form an antiferromagnetic layer of Mn, Fe, and Ni by mutual interdiffusion.

Massenet et al in "Magnetic Properties of Multilayer Films of FeNi-Mn-FeNiCo and of FeNi-Mn," IEEE Trans. Magnetics, MAG-1, 63–65 (1965) teach exchange coupling between an Mn film and an FeNi film in an FeNi-Mn-FeNiCo structure with Fe:Ni — 81:19 and for an Mn layer thinner than 150 Angstroms with coupling between the magnetizations of the FeNi and FeNiCo layers. The films were prepared by evaporation in a continuous magnetic field with the easy directions of magnetization parallel in the various layers and heated to 280° C, presumably to cause interdiffusion of Fe, Mn, and Ni to form an antiferromagnetic layer.

Such exchange coupling is also referred to in J. S. Kouvel, J. Phys. Chem. Solids, 24, 529 (1963).

All of the above prior art techniques require the use of annealing by heating to high temperatures to produce exchange coupling, which is undesirable for two reasons. First, it reduces permeability, i.e., increases coercivity which is highly undesirable. Second, in cases in which layering is desired and successive layers are to be biased in opposite directions, annealing of the last layer in a magnetic field would cause all layers to acquire an exchange bias field oriented in the same direction, which would exacerbate the problem of magnetic domains.

A multilayered film structure with more than two sets of exchange coupled films has not been described or taught in the prior art available. Perhaps this could be because there has not been available a technique for obtaining such a structure while maintaining high permeability. Furthermore, it would appear that the prior art has not recognized the possibility or desirability of reversing bias directions in successive sets of layers of exchange biased films.

When magnetic transducers are miniaturized to the extent that they are comparable in size to a magnetic domain, one begins to see anomalies in their electrical output which can be attributed to changes in the domain structure as the applied magnetic fields vary in strength. Troublesome discontinuous changes in sensitivity and linearity occur in the outputs of these miniaturized transducers and will be referred to as "Barkhausen noise," although the original meaning of the phrase was restricted to induced voltage spikes.

Magnetic domain effects result from changes in the position of domain walls. Hence, conceptually the effects can be eliminated by eliminating the domain walls or by making them immobile. This must be accomplished without destroying the high permeability which is required in all thin film transducer designs, and without destroying other properties, such as magnetoresistance or corrosion resistance, which are required for particular designs. Three approaches to this problem are considered below.

A first approach is to search for a material which, when used in small transducers, has no closure domains and hence no domain walls. This material must be so homogeneous and isotropic that its magnetization varies smoothly near edges to minimize the magnetostatic energy without breaking up into closure domains. Unfortunately, all known materials (including amorphous ones) have magnetic anisotropies which are large enough to cause the formation of closure domains.

A second approach is to have many walls, but to keep the magnetic excitation below the threshold for wall motion. Inductive film heads when used only for reading exemplify a situation in which excitation is quite small compared to the amount required to saturate a magnetic film. Hence, it is conceptually possible to use magnetic films with a large enough coercive force that domain wall motion never occurs during reading and high magnetic permeability results only from rotation of the magnetization within domains with fixed borders. However, all films previously made with high enough coercivity to prevent domain wall motion have had low permeability (as expected theoretically) and are thus useless to form low reluctance paths in magnetic transducers.

A third approach is to avoid domain walls by making each film a single domain. In very thin film elements such as a magnetoresistive stripe, it is possible to achieve this for certain geometries by use of an adjacent permanent magnet film (U.S. Pat. No. 3,840,898 supra) or a current-carrying conductor to produce an effective bias field. However, there are many geometries for which this is not possible. In particular, for transducers with relatively thick magnetic films (e.g., 1 to 10 $\mu$m thick) such as thin film inductive recording heads, this third approach in the form of these two bias schemes is not possible. A partial solution to this problem was taught by Jean Pierre Lazzari and Igor Melnick in "Integrated Magnetic Recording Heads," IEEE Transactions on Magnetics, Vol. MAG-7, No. 1, March 1971, pp. 146–150, who showed that laminating the magnetic yoke of thin film inductive recording heads eliminates those closure domains which are magnetized perpendicularly to the easy axis. However, no provision is made by Lazzari et al to prevent multiple domains with magnetizations parallel to the easy axis and hence domain walls are still possible.

In accordance with the teachings of this application, materials, processes, and structures are provided which allow one to fabricate magnetic films, each of which is a single domain. The goal of providing single domains is achieved by use of exchange anisotropy to bias magnetic films in a unique direction which is defined during device fabrication. The use of exchange anisotropy to control magnetic domains is not, by itself, a new invention. Glazer et al supra and Salanski et al supra teach the use of exchange anisotropy to stabilize magnetic domain configurations. However, the process, materials, and structures taught by them do not pertain to thin film magnetic recording heads. Furthermore, they are not practical for fabrication and satisfactory operation of thin film magnetic transducers as discussed below.

Many attempts have been made to attain a magnetic film with unidirectional anisotropy. These attempts prior to 1971 are reviewed in A. Yelon, "Interactions in Multilayer Magnetic Films," Physics of Thin Films, Vol. 6, 1971. Basically two approaches have been taken to achieve unidirectional anisotropy.

The first approach to obtaining unidirectional anisotropy is to couple a soft ferromagnetic film weakly with a permanent magnetic film so that the direction of unidirectional bias is determined by the direction of magnetization of the permanent magnetic film. There are a number of problems limiting the practical use of this approach. One is the inability to produce high coercivity films for use as the permanent magnet in the pair which do not substantially increase the dispersion (of the direction of magentization) and lower the permeability of the soft magnetic film when the two films are placed close enough together to obtain the weak coupling required to produce unidirectional anisotropy. Another problem is to produce this weak coupling in a reproducible way. All processes known to produce this weak coupling are believed to form thin films which have pinholes between the soft and permanent magnetic film, though there is some question in the literature whether some other mechanism may be involved in a few examples. However, all of these processes have been found to give very irreproducible (highly variable) strengths of coupling and hence irreproducible amounts of unidirectional anisotropy for the soft magnetic films. For these reasons, this approach is believed to be unsatisfactory for the fabrication of practical magnetic transducers.

The second approach to obtaining unidirectional anisotropy is through the exchange interaction between an antiferromagnetic material and a ferromagnetic material as has been used here. Most of this work has been done on inhomogeneous bulk samples (very thick materials) and is not applicable to fabricating thin film devices. In thin films, there has been work on oxidizing nickel, nickel-iron, and cobalt films to produce Ni-NiO and Co-CoO interfaces. Because 80:20 NiFe is the preferred magnetic film for transducers, data pertaining to it is most relevant to the instant application. According to Bajorek [Journal of Applied Physics 46, 1376 (1975)], the oxidation of 80:20 NiFe does produce unidirectional anisotropy but the ordering temperature (defined below under Definitions) is below room temperature, and so this process is useless for practical devices since the unidirectional anisotropy would be destroyed at room temperature. Work which did produce unidirectional anisotropy in thin films with ordering temperatures above room temperature was the system NiFe-NiFeMn, where the NiFeMn is usually produced by interfacial diffusion between a NiFe film and a superimposed Mn film [O. Massenet and R. Montmory, C. R. Acad Sci. 258, 1752 (1964), O. Massenet et al supra, Glazer et al supra, and Salanski et al supra].

Figures 1A, 1C:
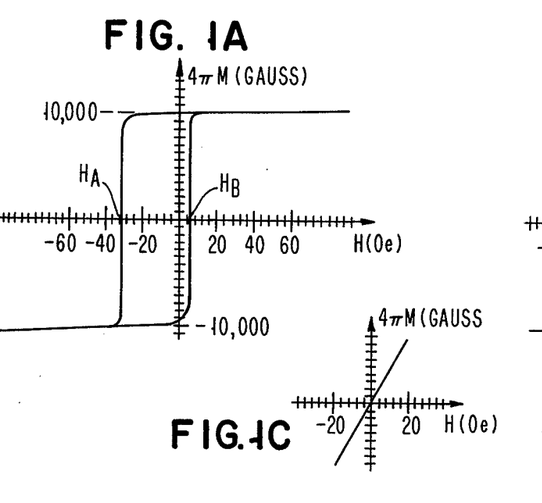
FIG. 1A shows the easy axis magnetization curve made according to the prior art as discussed above.
FIG. 1C shows the hard axis magnetization curve for the film of FIG. 1A with a reduced driving field H.
Figure 1B:
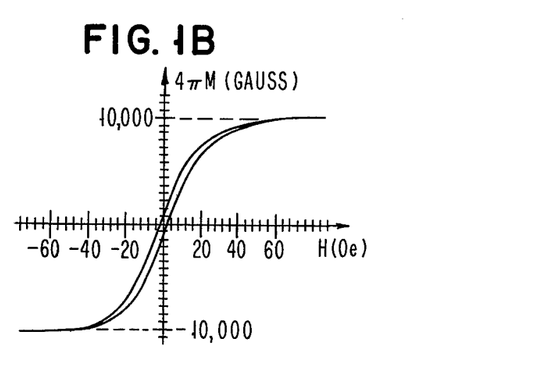
FIG. 1B shows the hard axis magnetization curve for the film of FIG. 1A.

Attempts were made to produce unidirectional anisotropy using this technique. FIG. 1A shows the easy axis magnetization curve for a film made according to the method of Glazer et al Sov. Physics - Solid State 8 pp. 2413–2420 (1967). The films deposited were 100 A° Mn and 600 Angstroms Permalloy Ni:Fe alloy on a substrate of oxidized silicon. As evaporated, the magnetic properties were similar to those of conventional Permalloy 80:20 NiFe alloy without manganese ($H_c$ = 2.4 oe, $H_k$ = 3.7 oe). FIG. 1A shows a coupling field $H_{ex}$ of 12 oersteds, in the absence of applied field, observed after a thermal diffusion step in the processss. FIG. 1B shows the hard axis curve for the same film. The minor loop for a reduced driving field is shown in FIG. 1C. Relative permeability is only 400. FIGS. 1A, 1B, and 1C have a horizontal scale of 20 Oe/large division and a vertical scale of 10,000 gauss for $4\pi M$.

This relative permeability is too low to be useful in a magnetic transducer. Also, the temperatures required to cause the required diffusion ($\frac{1}{2}300°$ C) are in excess of what the thin film structure of many transducers can tolerate. Furthermore, there is no way to make a laminated structure with alternate NiFe films biased in opposite directions.

All of these processes for developing unidirectional anisotropy involve annealing steps to produce surface oxidation, interdiffusion, or segregation of two phases to produce an antiferromagnetic-ferromagnetic interface. This puts severe limitations on the device to withstand the temperatures involved and also on the materials to be used, since the elements in the soft ferromagnetic film must be chosen to produce the correct antiferromagnetic film or vice versa.

Bajorek et al [U.S. Pat. No. 3,84098, n Note column 2, line 13, column 4, line 16, column 6, line 53, column 7, line 29 and claims 7 and 8 where the magnetically biased material is antiferromagnetic] teach the use of exchange coupling to produce permanent magnetic bias layers for an MR stripe. They teach the use of exchange coupling between an antiferromagnetic layer such as $\alpha Fe_2O_3$ and a soft magnetic material such as 80:20 NiFe to produce a permanent magnetic film which is then used to bias a second soft magnetic film (the MR stripe) by magnetostatic interaction between the two magnetic films and/or by exchange coupling between the two magnetic films through an insulating layer, for example, via pinholes in the insulating layer as described below. Nowhere do they teach the deliberate exchange coupling between an antiferromagnetic film and an MR stripe itself maintaining the soft magnetic properties of the MR stripe. This is because, in that patent as discussed above, for all known processes the exchange coupling between a soft magnetic film and an antiferromagnetic film caused an increase in the coercivity of the soft magnetic film making it useless as an MR stripe (which requires low coercivity and high permeability) but making it useful as a permanent magnetic film for biasing a second soft magnetic film which would be the MR stripe as envisioned in the Bajorek et al patent. In addition, nowhere do they mention a purposeful alignment of spins in the antiferromagnetic material, which is an essential part of this invention. Without this alignment of spins in the antiferromagnet, exchange coupling with a soft ferromagnetic film produces an increase in the coercivity of the soft film, which is precisely the result Bajorek et al desired to achieve. Furthermore, no distinction was made between depositing a ferromagnetic film on top of an antiferromagnetic film and the reverse order of deposition.

On the other hand, this application teaches the importance of depositing an antiferromagnetic film onto a ferromagnetic film in the presence of a magnetic field. In the alternative, if the antiferromagnetic film is deposited first, then this application teaches that the exchange coupled films must be heated above a critical temperature defined below as the ordering temperature and allowed to cool in a magnetic field to achieve the required magnetic spin alignment in the antiferromagnetic film. This critical temperature is less than the temperature used by Salanski et al and Glazer et al supra to produce diffusion between the layers.

Magnetoresistive thin film recording heads are particularly susceptible to Barkhausen noise, not only in the magnetoresistive film itself, but also in any adjacent magnetic members used for the purpose of shielding or resolution enhancement (Thompson, supra). The methods and materials of this invention may be used for magnetic domain control in any part of these transducers. However, a recently introduced structure known as the "barber pole" magnetoresistive stripe, Kujik et al, "The Barber Pole — a Linear Magnetoresistive Head, "IEEE Transactions on Magnetics, Vol. MAG-11, No. 5, September 1975, pp. 1215–1217, is unique in that it requires a unidirectional bias along the length of the stripe. This is because domains of opposite polarity produce electrical signals of opposite polarity; a multi-domain stripe will tend to produce no signal at all. Permanent magnet bias can be used only for extremely narrow track devices or for unshielded devices of low linear resolution. Current in the shorting bias produces useful bias only at very high current densities. Only exchange bias, as taught by this invention, can assure single domain behavior for the barber pole structure over a wide range of applications.

In accordance with this invention, a magnetic thin film structure includes a sandwich composed of layers including a first layer comprising a ferromagnetic material in direct atomic contact with a second layer of an antiferromagnetic material, the first layer having a coercivity less than about 10 Oersteds and a unidirectional magnetic bias sustained by an exchange interaction relationship with the second layer provided by alignment of spins in the antiferromagnetic material, and an exchange coupling field $H_e$ greater than the coercivity $H_c$ in the presence of said exchange interaction.

Further in accordance with this invention the antiferromagnetic material has a Neel temperature above the operating temperature of the transducer selected from the group consisting of Mn gamma phase alloys stable at room temperature in the gamma phase (face-centered cubic) and antiferromagnetic oxide including $\alpha Fe_2O_3$ and NiO, and more particularly the Mn gamma phase alloys are binary, ternary, and higher level alloys with elements selected from the group consisting of Fe, Co, Cu, Ge, Ni, Pt, and Rh with Mn.

Still further a third layer of a nonmagnetic material is provided in contact with the first and second layers, a fourth layer of a ferromagnetic material and a fifth layer of an antiferromagnetic material are in direct atomic contact with each other, the fourth and fifth layers being on the opposite side of the third layer, the fifth layer having a unidirectional bias direction sustained by an exchange interaction relationship with the fourth layer provided by alignment of spins in the antiferromagnetic material. Preferably the structure comprises a magnetic transducer and the nonmagnetic material includes a conductor which forms an inductive thin film magnetic sensor. It is also desirable that the second layer should be a separate, homogeneous layer having a substantial thickness as distinguished from an antiferromagnetic layer formed by diffusion.

Alternatively, the second layer is a vacuum deposited thin antiferromagnetic layer deposited while a magnetic field is applied to the first layer to provide the unidirectional anisotropy. Preferably, the first layer is an elongated narrow magnetoresistive sensor stripe, and the unidirectional magnetic bias has a substantial component along the length of the magnetoresistive sensor stripe. Furthermore, it is preferred that the second layer should have a second surface opposite from the first layer, a thin film of nonmagnetic material contacts the second surface, and a thin film of ferromagnetic biasing material is in direct contact with the nonmagnetic thin film on the opposite side thereof from the second surface. Alternatively, in the stripe embodiment a barber pole shorting metallization structure is deposited adjacent to and along the length of said stripe. In a modification, the second layer has a second surface opposite from the first layer, including a ferromagnetic thin film of low coercivity, highly permeable material in intimate exchange biasing relationship with the second surface of the second layer, with a unidirectional, magnetic anisotropy in the ferromagnetic film whereby an exchange coupled bias field is provided from the ferromagnetic thin film to the first film in a direction having a substantial component normal to the length of the elongated sensor stripe in the first layer.

In still another aspect of the basic invention, the magnetic thin film structure includes a third layer of a nonmagnetic material provided in contact with the second layer, and a fourth layer of a low coercivity, high permeability ferromagnetic material in contact with the opposite surface of the third layer having a magnetic isotropic characteristic accommodating return magnetic flux linkage from the first layer. Preferably, a fifth layer of a nonmagnetic material is in contact with the opposite surface of the fourth layer, a sixth thin layer film of a ferromagnetic material is in contact with the fifth layer and in direct atomic contact with a seventh layer of an antiferromagnetic material, the sixth layer having a coercivity less than about 10 Oersteds and a unidirectional magnetic bias sustained by an exchange interaction relationship with the seventh layer provided by alignment of spins in the antiferromagnetic material and an exchange coupling field $H_e$ greater than the coercivity $H_c$ in the presence of the exchange interaction.

In an entirely different aspect of the invention a method is provided for forming a magnetic thin film structure comprising depositing a first film of a low coercivity, highly permeable ferromagnetic material upon a substrate, and depositing a second layer of an antiferromagnetic material in direct atomic contact with the first film while maintaining a magnetic field upon the first film.

Alternatively a method of forming a magnetic thin film structure comprises depositing a pair of films upon a substrate, with a first one of the films comprising a ferromagnetic low coercivity (below 10 Oersteds) highly permeable material upon a substrate, a second one of the films comprising an antiferromagnetic material, the films being in direct atomic contact with each other, and subsequently heating the films above the ordering temperature while maintaining a unidirectional magnetic field applied to the films during cooling thereof producing an exchange interaction relationship between the films with alignment of spins in the antiferromagnetic material and an exchange coupling field $H_e$ greater than the coercivity in the presence of said exchange interaction while retaining low coercivity below 10 Oersteds in the first film.

In still another aspect of the invention a composition of matter is provided comprising a first material having a low coercivity of less than 10 Oersteds in direct atomic contact with a second material which is antiferromagnetic, with an exchange interaction relationship between the materials provided by alignment of spins in the antiferromagnetic material, and an exchange coupling field $H_e$ greater than the coercivity $H_c$ in the presence of the exchange interaction.

In general all of the features are adapted for use in thin film magnetic recording heads.

In accordance with this invention, a magnetic thin film transducer includes a sandwich composed of a plurality of layers including a first pair of layers including a layer of soft magnetic material in direct contact with a layer of antiferromagnetic material wherein the soft material has a unidirectional bias direction sustained by an exchange interaction relationship with the antiferromagnetic material, a nonmagnetic layer deposited upon the first pair of layers, a second pair of layers including a second layer of a soft magnetic material in direct contact with a second layer of antiferromagnetic material wherein the second layer of soft material has a unidirectional bias direction sustained by an exchange interaction relationship with the second layer of antiferromagnetic material.

Further in accordance with this invention, the unidirectional bias directions of the first and second pairs of layers are in opposite directions.

In another aspect of this invention, the second pair of layers is replaced by a single ferromagnetic layer.

In still another aspect of this invention, the nonmagnetic layer comprises a thin film conductor for an inductive magnetic recording head, wherein the second pair of layers is as originally stated.

In still another aspect of the invention, a barber pole structure is biased by a ferromagnetic layer exchange biased by an antiferromagnetic material.

Definitions

The phrase "ordering temperature" as employed herein refers to a temperature to which a sandwich of antiferromagnetic layer of material in direct contact with a layer of ferromagnetic material can be raised and then cooled while in an externally applied magnetic field, whereby its unidirectional bias will change to the direction of magnetization of the ferromagnetic layer caused by the externally applied magnetic field.

The phrase "exchange interaction relationship" as employed herein is intended to refer to the interaction between neighboring magnetic moments on the atomic scale which cause these neighboring magnetic moments to be either parallel (for ferromagnetism) or antiparallel (for antiferromagnetism). This applies within any single material but as used in this application refers to interaction between different materials at the interface between adjacent layers.

"Barkhausen noise" is employed to refer to discontinuous changes in sensitivity and linearity in the outputs of thin film magnetic transducers as well as induced voltage spikes.

"Coercivity $H_c$" is a measure of the width of the magnetization versus magnetizing field of the material. More specifically, in a plot showing the magnetization versus magnetizing field which approaches the positive and negative saturation values $M_s$, as for example FIG. 1A, if the fields $H_A$ and $H_B$ represent the values at which the magnetization passes through zero, then $$H_c = \left| \frac{H_A - H_B}{2} \right|$$

"Exchange bias field $H_E$" is a measure of the displacement of the M-H relationship from the H = 0 axis. More specifically, $$H_E = \left| \frac{H_A + H_B}{2} \right|$$

DETAILED DESCRIPTION OF THE PREFERRED EMBODIMENT

Figure 2:
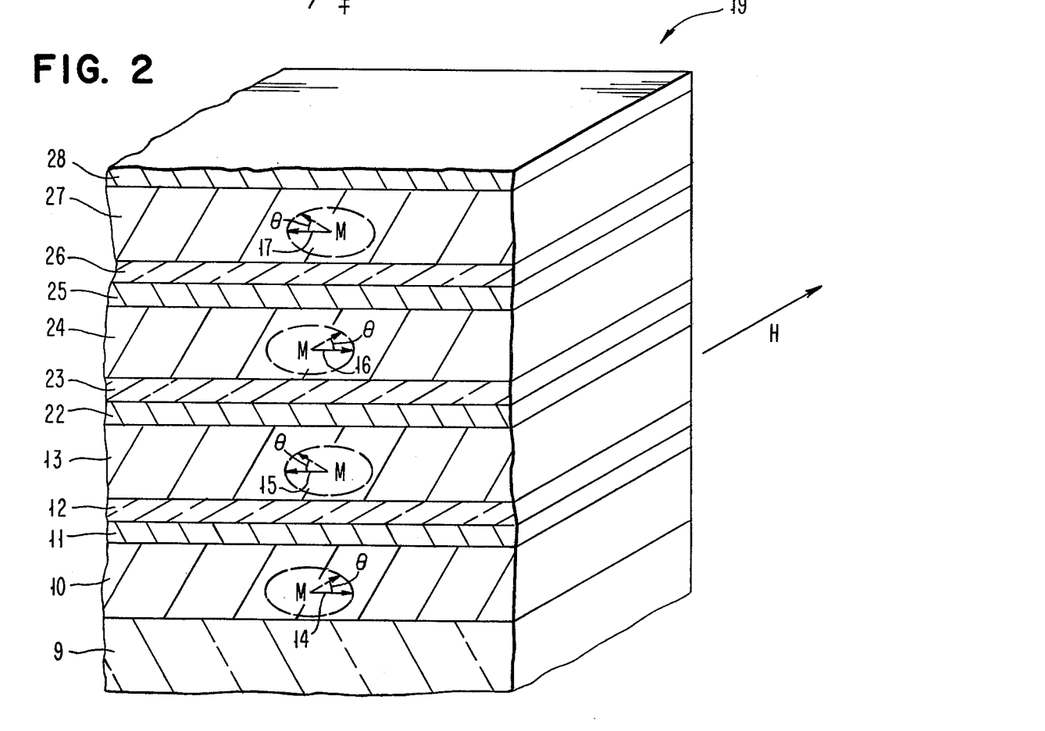
FIG. 2 shows a cross-section of a laminated film structure for an inductive or a magnetoresistive recording head.

The number of domain walls in the yoke of an inductive thin film head can be reduced substantially completely to zero by laminating the films which form the yoke, and making the laminations unidirectionally anisotropic so that the easy directions of the individual laminations are parallel to the medium and the gap direction and opposed to each other in successive laminations as shown in FIG. 2. Lamination reduces the magnetostatic energy of the quiescent state to a small value and thereby prevents the formation of closure domains, while the unidirectional bias will cause each lamination to behave as a single domain and thus prevent formation of domain walls.

The unidirectional bias can be achieved by exchange anisotropy, which occurs at the interface between suitably chosen ferromagnetic and antiferromagnetic materials. The easy direction of unidirectional anisotropy is determined preferably by the direction in which the ferromagnetic material is magnetized during deposition of the antiferromagnet, although, it can be determined later as described below.

In FIG. 2 a sectional view of laminated films is shown providing a magnetic shield or pole piece adapted for use with a magnetic head sensor. The laminated films, shown in FIG. 2, may be fabricated in the following way. A layer 10 of the ferromagnetic material, e.g., NiFe, is deposited on substrate 9 with a magnetic field applied parallel to the medium (in the plane of the page) and the gap direction parallel to the plane of the structure of substrate 9 so that a uniaxial anisotropy is established. This uniaxial anisotropy while preferred is not required. While the field is still applied, a thin layer 11 of a suitable antiferromagnetic material is deposited, which must be chosen in such a way that there is the desired amount of exchange coupling between it and the ferromagnetic material.

Next, a thin layer 12 (50 to 100 Å) of a nonmagnetic material is preferably deposited, to prevent exchange coupling between the antiferromagnet and the next ferromagnetic layer 13. The applied field direction is now reversed and the process is repeated. FIG. 2 shows a cross-section of the laminated film where the arrows 14–17 indicate the easy directions. One can achieve high permeabilities as shown in the formulas listed below.

Successive layers are deposited similarly. Layers 13, 24, and 27 are composed of ferromagnetic material like layer 10. Layers 11, 22, 25, and 28, etc. are all antiferromagnetic. Layers 12, 23, 26, etc. are all nonmagnetic to separate the antiferromagnetic layer below from the next ferromagnetic layer above. In the space 19 above layer 28, is located the gap containing either a conductor (insulated or not) or an inductive head or an insulated MR stripe for a magnetoresistive head followed by another structure from layers 10 to 28 in the same sequence. The material in gap 19 also serves as a "nonmagnetic" layer in any case whether of an inductive or magnetoresistive variety.

The ferromagnetic layers 10, 13, 24, and 27 have uniaxial as well as unidirectional anisotropy, and the drive field H of a magnetic recording medium is always at right angles to the easy axis. Hence, the energy density is:

$$E = -K_e \cos \theta \pm K_u \sin^2\theta - HM_s\sin \theta$$

where $K_u$ is the uniaxial anisotropy constant, $K_e$ is the exchange anisotropy constant, and $\theta$ is the angle between the magnetization M and the easy direction for an applied magnetic field H directed along axis $y$, which is perpendicular to the direction of unidirectional anisotropy. The plus sign is for uniaxial anisotropy parallel to the unidirectional anisotropy and the minus sign for uniaxial anisotropy perpendicular to the unidirectional anisotropy, i.e., parallel to the field H.

Setting $fE/f\theta = 0$ and introducing the anisotropy fields and $H_k = 2K_u/M_s$ and the exchange coupling field $H_e = K_e/M_s$, then:

$$H = H_e \tan\theta \pm H_k \sin\theta$$

For the read process, it is assumed that $\theta$ remains small, so that:

$$H \simeq (H_e \pm H_k) \sin\theta$$

The permeability $$\mu = \frac{4\pi M_y}{H} = \frac{4\pi M_s \sin\theta}{H,} = \frac{4\pi M_s}{(H_e \pm H_k)} \text{ for } (H_e \pm H_k) > 0$$

A reasonable value for $H_k$ is 4 Oe and for 80:20 nickel-iron, magnetization ($4\pi M_s$) is about 10,000 gauss. $H_e$ can be made in the range of 0 to 15 Oe resulting in permeabilities in the range of 1,000 to 2,000, which are acceptable for thin film transducers.

Figure 3A:
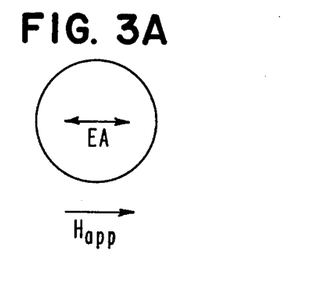
FIG. 3A shows the fields for deposition of a first layer of NiFe.
Figure 3B:
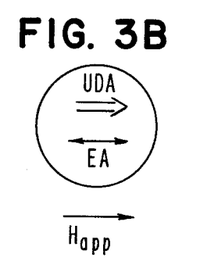
FIG. 3B shows the fields for deposition of a layer of FeMn upon the NiFe layer of FIG. 3A.
Figure 3C:
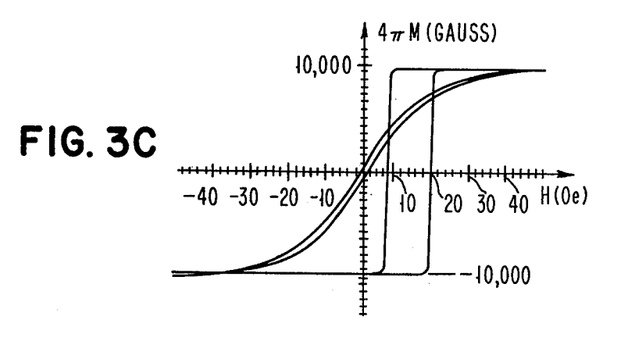
FIG. 3C shows the hysteresis loop of a set of films made in accordance with the technique described in connection with FIGS. 3A and 3B.
Figure 3D:
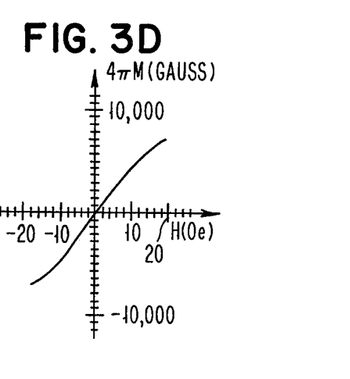
FIG. 3D shows the hysteresis loop of FIG. 3C with a reduced driving field H.
Figure 3E:
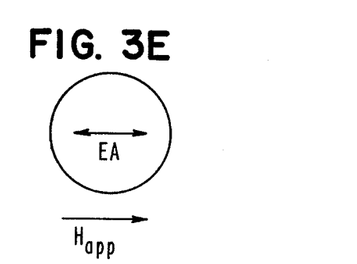
FIG. 3E shows the fields for deposition of a layer of NiFe with an easy axis as in FIG. 3A.
Figure 3F:
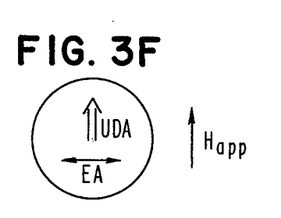
FIG. 3F shows the fields of a layer of FeMn deposited with an applied field $H_{app}$ at right angles to the easy axis in FIG. 3E.
Figure 3G:
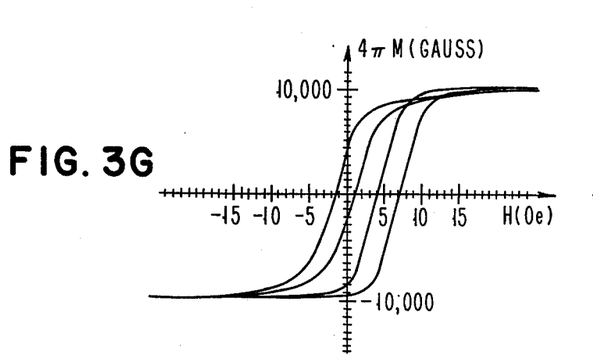
FIGS. 3G and 3H show hysteresis loops analogous to FIGS. 3C and 3D for the layers of FIGS. 3E and 3F.
Figure 3H:
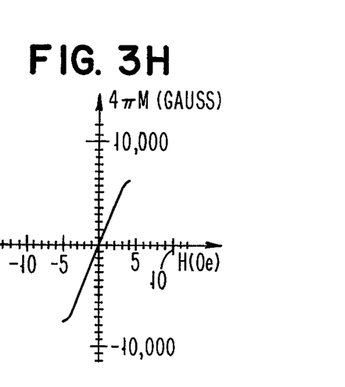

FIG. 3C shows the magnetization hysteresis (M-H) loop of a film made according to the method of this invention. A 500 Å thick film of 80:20 NiFe is evaporated first with an applied field $H_{app}$ as shown in FIG. 3A producing easy axis EA, followed by a 100 Å thick film of 57:43 FeMn with the field $H_{app}$ the same. External magnetic field $H_{app}$ is 60 Oe and the substrate temperature is 200° C with exchange coupling existing along the easy axis. FIG. 3B shows the fields for $H_{app}$ in the same direction while depositing a layer of FeMn antiferromagnetic layer leading to a unidirectional anisotropy (UDA) as shown. Both easy and hard axis curves are shown in FIG. 3C, with a hard axis minor loop shown in FIG. 3D, with the H drive level reduced. Note that the film is a single domain in the absence of an external field. $H_e$ is 11 Oersteds but $H_c$ is only 5 Oersteds. The relative permeability is 500. FIG. 3E shows the field $H_{app}$ for a similar film (500 Å thick film of 80:20 NiFe evaporated first followed by a 100 Å thick film of 63:37 FeMn at a substrate temperature of 200° C and cooled in an external magnetic field $H_{app}$ is FIG. 3F at a right angle to that used during the deposition in FIG. 3E so that the UDA which results from exchange coupling is along the unixial hard direction of the NiFe film of FIG. 3E, FIG. 3G shows the hard axis hysteresis loop for the structure of FIGS. 3E and 3F. The film has a closed hysteresis loop for reduced H field as shown in FIG. 3H in all excitation directions. The film is a single domain in the absence of an external field, with $H_e$ of 5.5 Oersted. The relative permeability is 2000.

More generally, the process and materials used to achieve unidirectional anisotropy are now described. A film of soft magnetic material such as 80:20 NiFe (Permalloy alloy) is first evaporated or sputtered in an external magnetic field at a substrate temperature in the range of room temperature up to 300° C and a thickness in the range of 100 Å up to a few thousand Angstroms. Subsequently, an antiferromagnetic film such as 50:50 or other materials as discussed below is evaporated or sputtered without exposing the surface of the soft magnetic film to air since the resultant oxide layer would inhibit the exchange interaction between the NiFe and antiferromagnetic films. During deposition of the antiferromagnetic film, the direction of the magnetic field can be in the same direction as it was during the deposition of the soft ferromagnetic film. If the soft magnetic material has an induced easy axis such as Permalloy NiFe alloy, this will align the unidirectional bias along the easy axis. Alternatively, the direction of the magnetic field can be changed to cause the unidirectional bias to be at some angle with the easy axis of the soft magnetic film, since the unidirectional bias will be in the direction of the magnetization of the soft films when the antiferromagnetic film is deposited, (one must hold H applied until the temperature is less than $T_o$, as the antiferromagnetic layer cools down) unless the antiferromagnetic film is heated above the critical temperature defined above as the ordering temperature. Of particular importance is a case of this kind in which the unidirectional bias is along the hard axis of the soft magnetic film. The coercivity and offset of the B-H loop of the soft magnetic film along the direction of the unidirectional bias are both reduced and the permeability is increased. This reduction is particularly important for using this process in making films for magnetoresistive sensors.

If the order of deposition of these two films is reversed, and the substrate is amorphous, then no unidirectional bias is observed. If the substrate is crystalline, for example a previously deposited film of copper or palladium, then the unidirectional bias is obtained if heated above $T_o$ and cooled in a magnetic field, although, it is generally weaker than in the normal order of deposition. This is believed to be due to a dependence of the crystalline structure of the antiferromagnet on the structure of the surface onto which it is deposited.

A second soft magnetic film can be evaporated onto the manganese alloy film. The unidirectional bias of the second soft magnetic film will be less than that of the first and its direction will depend upon the direction of the external magnetic field during the evaporation of the second soft film if the deposition is done below the ordering temperature. Using 80:20 NiFe alloy for the soft magnetic films and 50:50 FeMn for the antiferromagnetic layer the following were obtained. For 400 Å NiFe, 100 Å to 1000 Å FeMn, and 300 Å NiFe the unidirectional bias directions for the two NiFe wafers were opposite to one another when the external magnetic field was reversed for the second NiFe film. For FeMn thickness above 1000 Å no unidirectional bias was obtained for the second NiFe film.

The result using opposed external field for subsequent layers is important for multilayered shields for MR heads or yokes for thin film inductive heads because it forces subsequent NiFe layers to have magnetization pointing in opposite directions. This, in turn, eliminates the closure domains which are present if the magnetizations in all the layers point in the same direction.

Figure 4A:
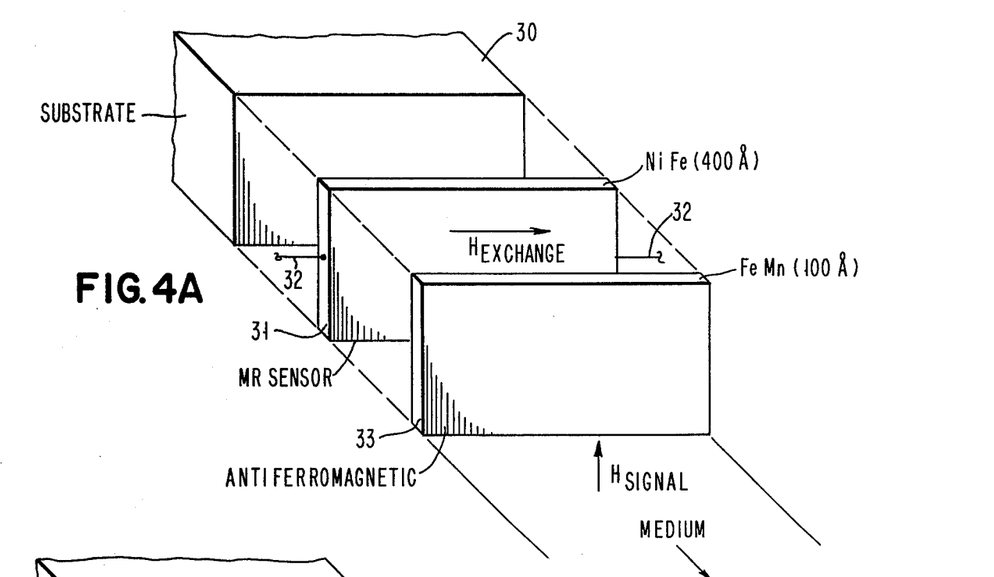
FIG. 4A shows an exploded perspective view of a magnetoresistive sensor deposited upon a substrate with a layer of antiferromagnetic material deposited on the sensor to provide direct magnetic bias of the magnetoresistive sensor by direct exchange interaction.

In magnetoresistive sensors, it is important to provide magnetic bias for the magnetoresistive film element. This can be provided by external magnetic fields, or as taught by Bajorek et al, supra, by magnetostatic interaction with an adjacent permanently magnetized layer or combination of layers. The previous art does not teach the use of direct exchange coupling to the magnetoresistive film for providing bias, since means of providing such bias without degradation of the magnetic properties was not known. The methods and materials herein disclosed make this possible. FIG. 4A shows a magnetoresistive stripe sensor utilizing direct exchange coupling as a biasing means.

Figure 4B:
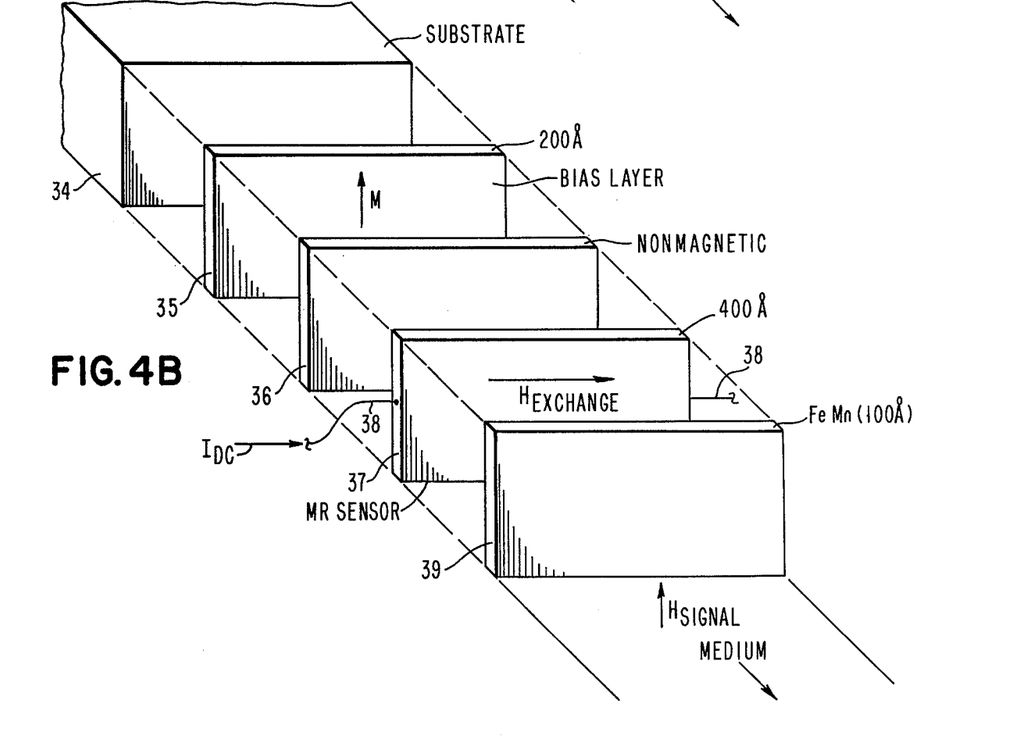
FIG. 4B shows an exploded perspective view of an MR sensor of the variety shown in FIG. 4A with the addition of an intermediate nonmagnetic layer and a layer of very low coercivity material provided for the purpose of providing bias as a result of the magnetic field produced by the DC bias current through the MR sensor.

In FIG. 4A a substrate 30 is shown upon which is deposited a thin film stripe 31 of a magnetoresistive sensor film (MR sensor) which is preferably 80:20 NiFe about 400 Å thick having a pair of electrical leads 32 which are connected to the MR stripe 31 by conventional thin film materials techniques. The leads are adapted to be connected to a DC bias source and to magnetic recording electronic circuits as is well known in this film magnetic recording technology. Directly upon stripe 31 is deposited a thin film of an antiferromagnetic material 33 such as a 100 Å thick layer of FeMn to provide a magnetic bias of the MR stripe 31 by exchange coupling field $H_{EXCHANGE}$ either by depositing the film 33 while MR stripe 31 is magnetized by an external magnetic source, or by heating the completed structure above the ordering temperature and cooling in the presence of an external magnetic field. The specific direction of the unidirectional anisotropy provided in MR stripe 31 will depend upon the specific requirements of the MR sensor being employed but is shown along the length of the stripe. It could be at a 45° angle to provide a component of the magnetic vield with the kind of bias field M provided by layer 35 in FIG. 4B as described below. The techniques of FIGS. 3A and 3B can be used. in FIG. 4B, a substrate 34 has a thin longitudinal biasing film 35 of a soft, high permeability (low coercivity) material such as a 200 Å thick NiFe 80:20 film deposited thereon as an inductive soft magnetic biasing material providing a magnetization field M in response to current $I_{DC}$. Such a biasing material is described in Beaulieu et al U.S. Pat. No. 3,864,751 for an "Induced Bias Magnetoresistive Read Transducer." Next a layer 36 of nonmagnetic material such as $SiO_2$ is deposited upon biasing film 35. Next an MR sensor stripe 37 with leads 38 and then an antiferromagnetic layer 39 as in FIG. 4A are deposited respectively for similar reasons. The structure of FIG. 4B is provide a directly exchange biased MR sensor stripe having a bias $H_{EXCHANGE}$ plus the longitudinal soft self-biasing layer 35. The bias $H_{EXCHANGE}$ avoids Barkhausen noise.

The magnetoresistive sensor shown in FIG. 4A has no transverse magnetic bias (i.e., parallel to the magnetic signal field $H_{SIGNAL}$), and will therefore produce a unipolar, quadratic output for small signals. In many applications it is necessary to linearize the output by use of such a bias or by use of a barber pole shorting bar structure as shown in FIGS. 4A and 4B. Transverse bias can be provided by orienting the exchange coupling field at approximately 45° from the direction shown in FIG. 4A, or by addition of other permanent magnet or magnetically soft bias layers. From the point of view of fabrication, FIG. 4B shows one such combination, which has the virtue tht no new materials are added in the thin film deposition processes, thereby requiring a less complex thin film evaporation or sputtering system.

Figure 4C:
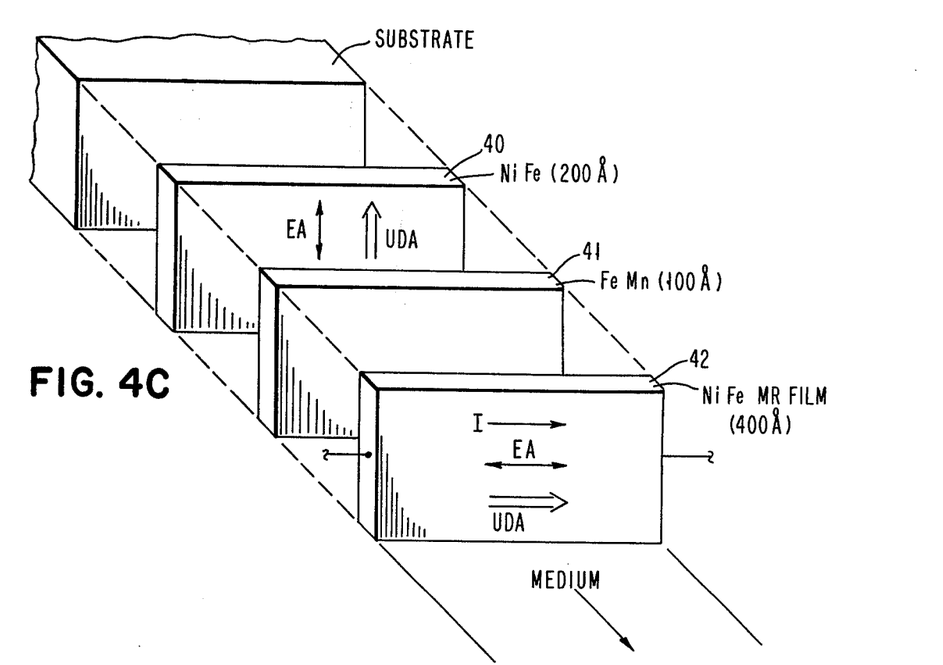
FIG. 4C shows an exploded perspective view of a ferromagnetic film deposited upon a substrate with an adjacent layer of antiferromagnetic film followed by a second ferromagnetic film wherein the two films have easy axes at right angles.

It is also possible to combine direct exchange coupling with magnetostatic coupling as shown in FIG. 4C.

In FIG. 4C is shown a case in which the external magnetic field applied during fabrication for the second NiFe film is at right angles to that for the first NiFe layer, then the resulting unidirectional biases are at right angles for a structure 200 Å NiFe, 100 Å FeMn, 400 Å NiFe. This technique is important for combined exchange anisotropy and soft film biases. The first layer 40 deposited on the substrate is a soft bias layer and the exchange anisotropy with film 41 of FeMn helps keep the soft film in saturation while the second NiFe film 42, which is used for magnetoresistive sensing, is being switched. The exchange anisotropy bias of the second layer eliminates Barkhausen noise by insuring that the MR layer remains a single domain while it is being switched.

Figure 4D:
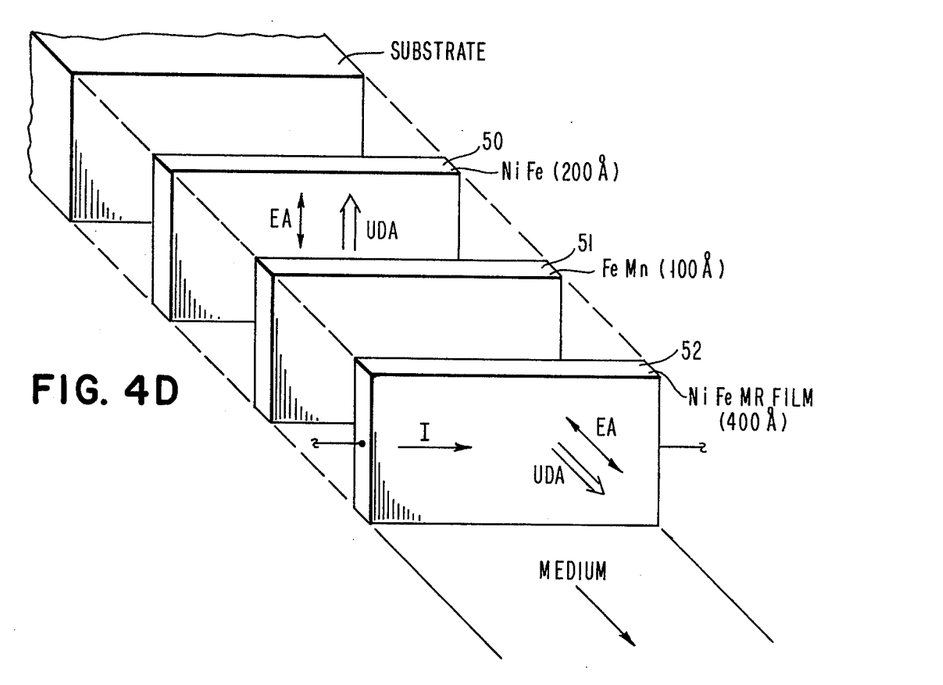
FIG. 4D is similar to FIG. 4A wherein the two successive ferromagnetic films have easy axes differing in direction by 135° in their respective parallel planes.

Other angular relationships between the unidirectional anisotropies of successive ferromagnetic layers in addition to the parallel and the perpendicular cases are also possible. One particularly important case is shown in FIG. 4D where the angle between the directions for unidirectional anisotropy for two NiFE films 50 and 52 is 135°. This is useful for a combined soft film-unidirectional anisotropy bias in an MR head since the unidirectional bias for the soft film 50 helps keep that film in saturation and the unidirectional bias for the MR film 52 helps bias that film at 45° to the current direction I.

If the soft and antiferromagnetic film structure is heated above a certain temperature, defined above as the ordering temperature, and then cooled down below the ordering temperature, then the direction of the unidirectional bias will change to whatever direction the magnetization of the 80:20 NiFe Permalloy alloy adjacent to the antiferromagnetic film possesses during the stage of cooling below the ordering temperature. This effect can be used to alter the direction of the unidirectional coupling after the films (or even the device) are made. Several methods can be used to establish the desired direction for the soft films' magnetization: an exteral field; the demagnetization fields of adjacent magnetic layers; the magnetic fields produce by current being carried by adjacent metal films either magnetic or non-magnetic; or any combination of the above. In some cases it may suffice just to "freeze" in some domain structure formed naturally or by ac demagnetization.

Figure 5:
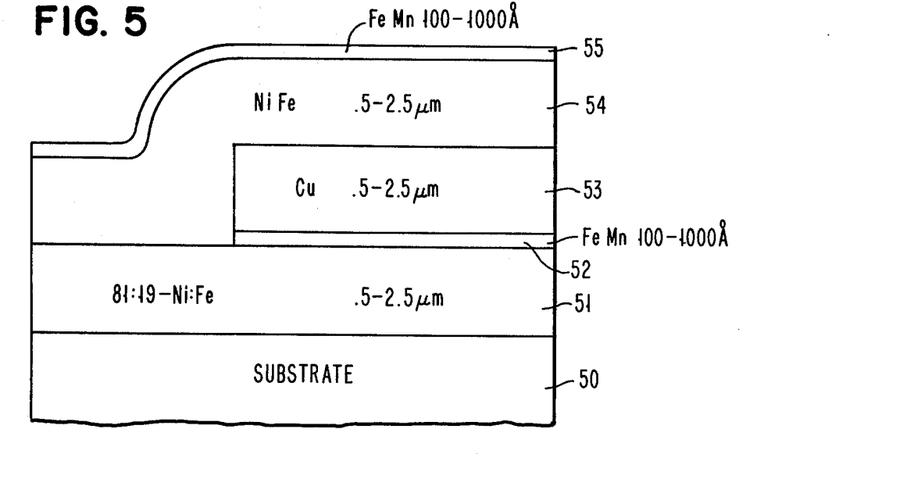
FIG. 5 shows a thin film single-turn inductive head having shields of magnetic material including a ferromagnetic layer upon which is deposited an antiferromagnetic layer to provide anisotropic magnetic domains by means of exchange coupling.

An embodiment used to reduce Barkhausen noise which uses the ability to "freeze" in one unique domain structure is shown in FIG. 5. A nonlaminated soft magnetic film (such as 80:20 NiFe) 51 is deposited on a substrate 50. Subsequently, an antiferromagnetic layer 52 is deposited on the NiFe with no applied magnetic field. If the surface of the soft magnetic layer 51 has been allowed to oxidize before deposition of the antiferromagnetic layer (e.g., by exposure to air), then that oxide layer must be removed before the antiferromagnetic layer 52 is deposited, e.g., by sputter etching. A gap layer of copper or alternatively an insulated MR stripe 53 is then deposited followed by another soft ferromagnetic film 54 and antiferromagnetic film 55 deposited as described above. If this structure is heated above the ordering temperature subsequent to deposition of the magnetic layers, then it should be cooled in the absence of an applied magnetic field so that some pattern of closure domains exists in each of the ferromagnetic films during the ordering of the antiferromagnetic films. A single magnetic domain cannot be achieved in each of the magnetic legs of a head where the legs are not laminated because of demagnetizing effects in a single film leading to closure domains as discussed above. Because this one pattern of closure domains is now the most energetically favored, it will be reestablished after any perturbation (such as by external magnetic fields or read/writing on a magnetic medium) is removed. Hence, the magnetic read/write efficiency is more stable than if a new closure domain pattern is (randomly) created after magnetic perturbation.

This ability for the direction of unidirectional anisotropy to reorient above an ordering temperature can place a limit on the processing temperature of devices made with unidirectional anisotropy unless the reorientation can be controlled. One particular laminated structure which makes this control possible even after the device is made is that shown in FIG. 6. This structure is constructed similarly to that shown in FIG. 2 (as discussed above) except that every alternate soft ferromagnetic film is made with no unidirectional biasing layer. In particular, the following layers are deposited in the presence of an applied magnetic field parallel to the easy axis direction required for the device being fabricated:

(1) a layer of ferromagnetic material, e.g., 1000 Å of NiFe;
(2) a thin layer of a suitable antiferromagnetic material (about 100 Å)
(3) a thin layer of a nonmagnetic material (50 to 100 Å);
(4) a layer of the ferromagnetic material;
(5) a layer of the nonmagnetic material; and so on. Hence, only every other ferromagnetic layer will be unidirectionally biased by exchange anisotropy. Note that the direction of the applied magnetic film need not be reversed during fabrication of this structure. If during processing subsequent to fabrication of the above structure it is heated above the ordering temperature, the desired direction of unidirectional anisotropy can be reestablished by cooling down below the ordering temperature in the presence of an applied magnetic field in the direction required for the unidirectional anisotropy. This insures that the alternate ferromagnetic layers which are unidirectionally biased will be single domains. The magnetostatic interaction at the edges of this structure between the ferromagnetic films which are biased by unidirectional anisotropy and those which are not causes the latter also to be single domains with magnetizations pointing in the opposite direction to the magnetization in the former films. Thus, the structure in FIG. 6 has single domain ferromagnetic films with alternating directions of magnetization just as the structure in FIG. 2 without the limitation on processing temperatures of the latter structure.

Figure 6:
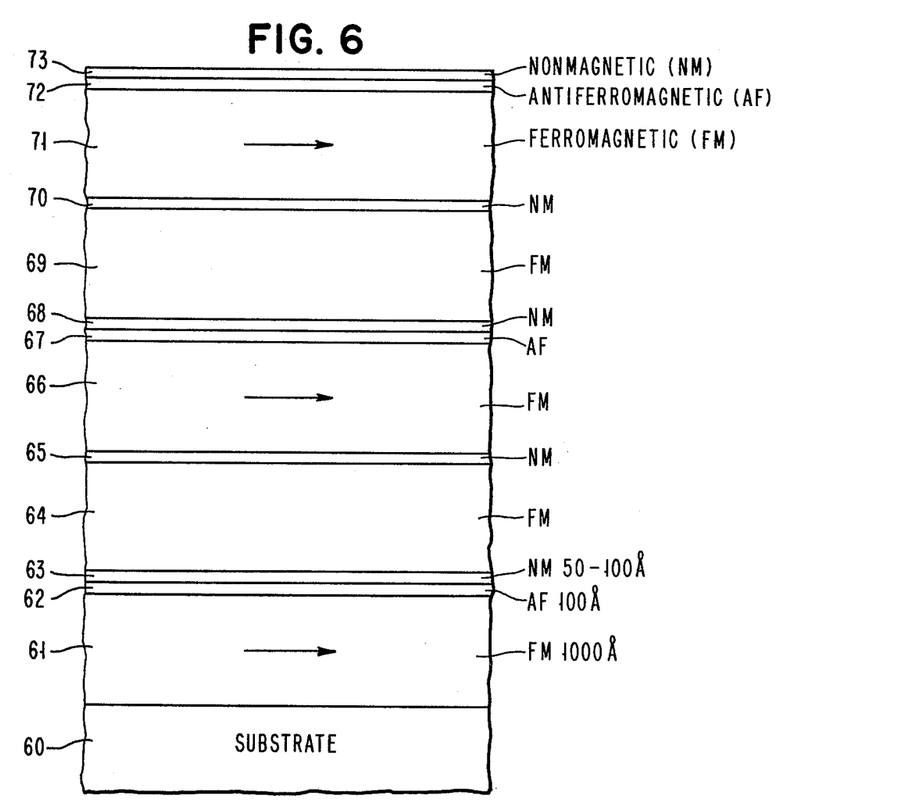
FIG. 6 shows a multilayer structure with alternating layers of exchange coupled ferromagnetic and antiferromagnetic materials in a sandwich followed by a layer of a nonmagnetic material and a layer of a ferromagnetic material alone.

FIG. 6 shows a multilayer structure with alternating layers of exchange coupled ferromagnetic and antiferromagnetic materials together in a sandwich and then a layer of ferromagnetic material alone, with alternating easy axes. More specifically, a substrate 60 is created with a layer 61 of ferromagnetic material having an easy axis provided be employing an external magnetic field parallel to the substrate and the gap, similarly to layer 10 in FIG. 2. Layer 61 may be 1000 Angstroms thick composed of 80:20 NiFe. Next a thin layer of an antiferromagnetic mayerial, layer 62, is deposited upon layer 61 to a thickness of about 100 Angstroms.

A thin nonmagnetic layer 63 is deposited next, to a thickness of 50–100 Angstroms. Next, a layer 64 of ferromagnetic material is deposited upon layer 63, followed by deposition thereon of a layer 65 of nonmagnetic material, and so on, with layers 66 and 71 being ferromagnetic layers (like layer 61) having exchange anisotropic relationships with ferromagnetic layers 67 and 72 and ferromagnetic layer 69 being analogous to layer 64. Nonmagnetic layers 68 and 73 and analogous to layer 63 and nonmagnetic layer 70 is analogous to layer 65. Only every other ferromagnetic layer (61, 66, and 71) is unidirectionally biased by exchange anisotropy, at least in the sense of direct contact. The alternate layers are biased by the closure of the magnetic fields from layers 61, 66, and 71 into layers 63 and 69, thereby providing a bias in the direction opposite to the arrows.

A significant advantage of this form of exchange anisotropy is that the proper magnetization can be restored or provided, as the case may be, following any heating required in fabrication of a magnetic transducer or any other device employing this form of multilayer structure. The magnetization is restored by cooling the films while an external magnetic field is applied in the proper direction to achieve the desired direction of magnetization while the films cool below the ordering temperature to produce the unidirectional anisotropies shown by the arrows in FIG. 6.

In layers 61, 66, and 71, there will always be a component of magnetization in the easy direction, as in FIG. 2, since the drive field is at right angles to that direction during reading and writing in a thin film head. Hence, the other ferromagnetic layers 64 and 69 are biased in opposite directions by magnetostatic interaction. It is, therefore, not necessary to have exchange coupling anisotropy to control the magnetic fields in these intermediate layers 64 and 69. However, satisfactory operation of the bias layers 64 and 69 depends on the magnitude of anisotropy induced in those layers 61, 66, and 71 which have anisotropic characteristics induced by the antiferromagnetic layers with which they are in intimate contact. Such magnitude of anisotropy of a magnetic nature can be accurately controlled by varying the thickness of the ferromagnetic layers, since the unidirectional anisotropy field is given by $H_E = E/(M_s t)$ where E is the exchange-anisotropy energy, $M_s$ is the saturation magnetization, and $t$ is the thickness of the ferromagnetic layer. This alternative embodiment provides a head or transducer designer with a wide range of materials from which to choose in making a decision as to how to design a laminated yoke for a magnetic head.

Materials

An antiferromagnetic film adapted for use in accordance with this invention must be made of material which has a Neel temperature ($T_n$) (temperature at which an antiferromagnetic material becomes paramagnetic) which is analogous to the Curie temperature for a ferromagnetic material higher than the operating temperature of the magnetic transducer. There are two classes of materials which have been found to work Neel temperatures ($T_n$) that high. One class is manganese alloys which are stable at room temperature in the gamma phase (face-centered cubic); in particular, MnFe near 50:50 composition. Another class comprises the antiferromagnetic oxides such as $\alpha Fe_2O_3$. Not all materials which are stated in the literature to be antiferromagnetic in bulk form with high Neel temperatures work. For example, $Fe_3Al$ was reported by G. Rassman and H. Wick, Arch. Eisenhuettenw, 33, 115 (1963) to be antiferromagnetic with $T_n = 750°$ K; but iron-aluminum films at and near the $Fe_3Al$ composition were tried and did not give unidirectional anisotropy. Other alloys have been reported to have high values of $T_n$ but when they were tried, they also did not work. They include: Al-Cr alloys near $AlCr_2$ composition; MnPd alloys near MnPd composition; CrMn alloys from about 1% to about 90% Mn. Note that neither CrMn nor MnPd has a stable $gamma_{Mn}$ phase at room temperature. It is believed that the crystalline and/or magnetic spin structure of these materials when evaporated in thin film form is not what is required to produce unidirectional anisotropy.

From Hansen (Constitution of Binary Alloys, McGraw-Hill) there are a number of binary allows with gamma$_{Mn}$ phases which are stable at room temperature, for example: CoMn, CuMn, GeMn, FeMn, MnNi, MnPt, and MnRh. Of these materials, FeMn, MnNi, MnPt, and MnRh produce unidirectional anisotropy when evaporated onto the unoxidized surface of 80:20 NiFe films. Furthermore, ternary and higher component numbered alloys of Mn are possible as long as they have a gamma$_{Mn}$ phase stable at room temperature. In particular, NiFeMn alloys were tried with NiFe ratios of: 80:20, 40:60, and 20:80, and all produced unidirectional anisotropy when evaporated onto 80:20 NiFe films. Of all these manganese alloys tested, the FeMn system showed the highest ordering temperature.

Figure 7:
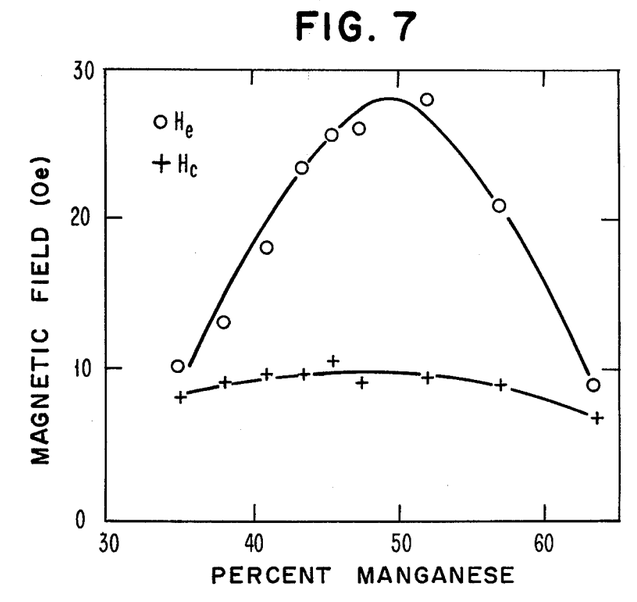
FIG. 7 shows a magnetic field vs. percent manganese for a NiFe film upon which is deposited an FeMn film in an exchange biased relationship.

In FIG. 7 is shown the shift in the B-H loop from the origin $H_e$ and $H_c$ is the easy axis coercivity of 400 Å thick NiFe films onto which 130 Å thick FeMn films of varying Fe:Mn ratio had been deposited with the NiFe films saturated along their easy axis. Note that the shift in B-H loop has a peak at about the same composition as the hyperfine field in FeMn measured by C. Kimball, W. D. Gerber, and A. Arrott, Journal Applied Physics 34, 1046 (1963). This is taken as a confirmation that the unidirectional anisotropy is a result of the exchange interaction between antiferromagnetic FeMn and ferromagnetic NiFe.

Switching of the direction of unidirectional anisotropy was observed by heating the films in a magnetic field at right angles to the original anisotropy direction. For sufficiently high temperatures, it was observed that the direction of anisotropy would rotate towards the direction of the applied magnetic field. The rate of rotation increased as the temperature was increased, so that instead of an abrupt rotation at a well defined ordering temperature, it was found that a range of temperatures existed over which rotation would occur at sufficiently long time intervals. The standard test used was a 90° rotation in 15 min. and a 130 Å thick FeMn film with 50:50 Fe:Mn ratio on 400 Å thick NiFe (80:20) film produced 90° rotation in 15 min. at 120° C.

The need for the right crystalline structure is demonstrated by the results of depositing 50:50 FeMn directly on an amorphous substrate and then depositing the NiFe. When this is done, no unidirectional anisotropy is produced even if the films are heated in a magnetic field above the Neel temperature of the FeMn. However, if a copper or palladium film (both having the face-centered cubic cyrstalline structure) is deposited first, then the 50:50 FeMn film followed by an 80:20 NiFe film, then the NiFe film does not have unidirectional anisotropy. Since 80:20 NiFe is also face-centered cubic, it appears important that the FeMn be deposited onto a surface with face-centered cubic structure to obtain the same crystal structure in the FeMn film.

The other class of antiferromagnetic materials expected to produce unidirectional anisotropy is the antiferromagnetic oxides such as $\alpha Fe_2O_3$ and NiO. Since $\alpha Fe_2O_3$ has a higher Neel temperature (677° C) compared to NiO (250° C) it is expected that $\alpha Fe_2O_3$ will produce higher ordering temperatures. It has been shown that films sputtered from an $Fe_2O_3$ target onto 80:20 NiFe films produce unidirectional anisotropy in the NiFe film.

Figure 8:
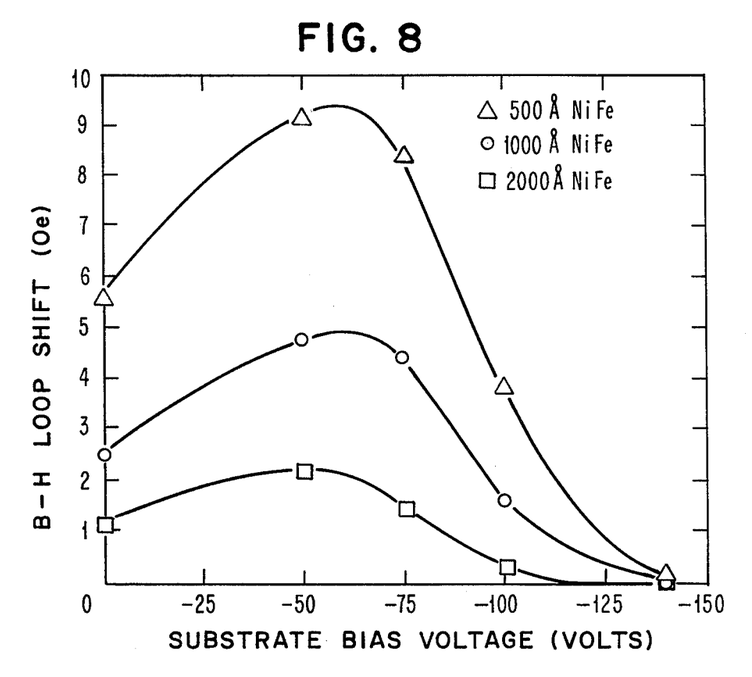
FIG. 8 shows the B-H loop shift vs. substrate bias voltage for an $Fe_2O_3$ film deposited on NiFe films.

To prove feasibility, evaporated Permalloy films (80:20 NiFe) of thickness 500 Å, 1000 Å, and 2000 Å were used for the soft magnetic materials. Because the films had to be recovered from the evaporator and place in an rf sputtering system, a native oxide was formed on the NiFe film surface during exposure to air. This native oxide had to be removed before the $Fe_2O_3$ film was sputtered or else it would prevent the exchange coupling between the Permalloy and $Fe_2O_3$ at room temperature (at cryogenic temperatures there may possibly still be an exchange coupling through the native oxide). After the NiFe films were sputter etched, a film was deposited by rf sputtering from an $Fe_2O_3$ target with argon gas. The resulting film is expected to be $\alpha Fe_2O_3$, probably with some oxygen deficiency, but this has not been vertified. During sputter deposition of the $Fe_2O_3$ film, the magnetization of the NiFe film was maintained by an external magnetic field in the same direction in which the unidirectional anisotropy was to be The unidirectional anisotropy of the NiFe film as a result of this overlay of $Fe_2O_3$ was found to depend upon the sputtering conditions. In particular, the shift in B-H loop of the 80:20 NiFe film was found to depend upon: target voltage and power; substrate bias voltage; $Fe_2O_3$ film thickness and NiFe film thickness. In FIG. 8, is shown the dependence of the shift in B-H loop on substrate bias voltage and NiFe film thickness with: target voltage of −1500 volt, 20μm argon gas pressure; and $Fe_2O_3$ film of approximately 850 Å. When heated in a magnetic field at right angles to the original direction of unidirectional anisotropy for a sample with 400 Å thick 80:20 NiFe, 850 Å thick $Fe_2O_3$ (sputtered at: −50 volt substrate bias voltage; −1500 volt target voltage; and 20μm argon gas pressure), the direction of unidirectional anisotropy switched 90° in 15 min. at 150° C.

Although these samples were made by evaporating the NiFe and sputtering the $Fe_2O_3$, it is preferred to sputter both the NiFe and $Fe_2O_3$, in a multitarget sputtering system for improved magnetic properties.

Low Coercivity Criteria

The desired coercivity of the ferromagnetic films which are exchange biased would be less than about 10 Oersteds in general. On the other hand, the materials of the Bajorek et al patent supra had high coercivities on the order of 50 - 100 Oe or 10 times $H_k$ where $H_k$ is the anisotropy energy. The low coercivity is provided by the alignment of spins in the antiferromagnetic material by means of the processes described above in accordance with this invention. A high permeability of over 500 is also desired for such exchange biased films, and the exchange coupling field $H_e$ should be greater than the coercivity $H_c$ in the presence of exchange interaction.

Figure 9A:
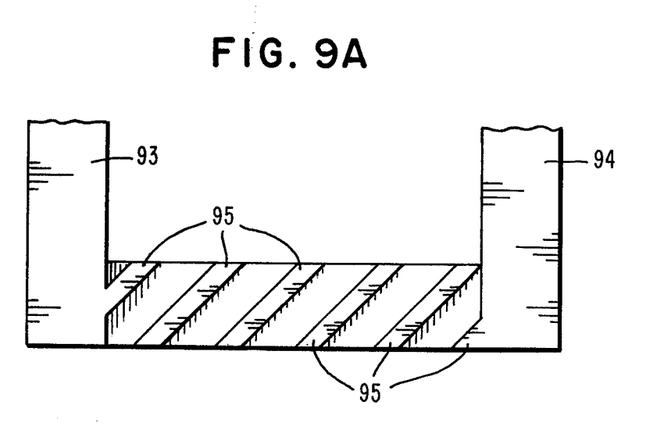
FIG. 9A shows a plan view of a barber pole MR head.
Figure 9B:
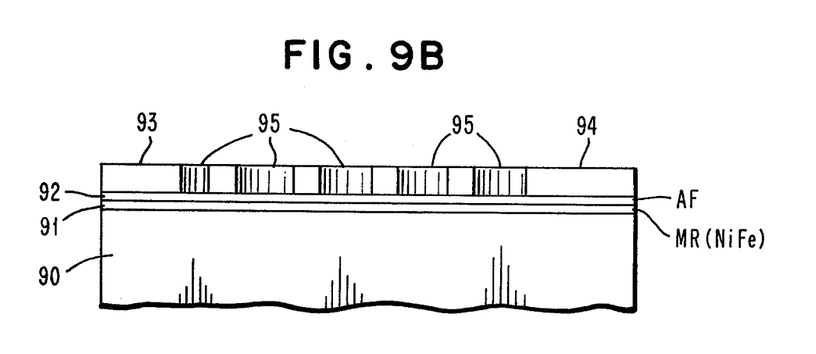
FIG. 9B shows a front elevation of the head of FIG. 9A.

FIG. 9A shows a plan view and FIG. 9B shows an elevation of a structure employing exchange bias for a barber pole magnetoresistive head based in part upon Kuijk et al supra. A substrate 90 is coated with a thin film stripe 91 of NiFe 80:20 comprising a magnetoresistive sensor. A thin film stripe 92 of an antiferromagnetic material such as FeMn is deposited upon thin film 91. Gold connecting leads 93 and 94 and goldshorting bars 95 which are diagonally aligned with the stripes 91 and 92 are deposited upon stripe 92 with leads 93 and 94 extending out across substrate 90 to pads (not shown). Applicants have discovered that the use of a bias layer composed of exchange biased ferromagnetic material yields significantly enhanced results of operation of a barber pole head. A composite stripe consisting of layers 91 and 92 is substituted for the magnetoresistive layer of Kuijk et al. A magnetic field aligned in a direction parallel to the eventual stripe direction is used during fabrication to induce a unidirectional bias field in the composite stripe which causes it to exhibit single domain behavior. The field can be applied during deposition or subsequently by heating above the ordering temperature and cooling. This embodiment is adapted to use in connection with conductive antiferromagnetic materials which permit the shorting bars to function.

We claim:

1. A magnetic thin film structure including a sandwich composed of layers including
   a first layer comprising a ferromagnetic material in direct atomic contact with a second layer of an antiferromagnetic material,
   said first layer having a coercivity of less than about 10 Oersteds
and a unidirectional magnetic bias sustained by an exchange interaction relationship with said second layer provided by alignment of spins in said antiferromagnetic material, and
   an exchange coupling field $H_e$ greater than the coercivity $H_c$ in the presence of said exchange interaction.

2. A magnetic thin film structure in accordance with claim 1, wherein said antiferromagnetic material has a Neel temperature above the operating temperature of said transducer selected from the group consisting of Mn gamma phase alloys stable at room temperature in the gamma phase (face-centered cubic) and antiferromagnetic oxide including $\alpha Fe_2O_3$ and NiO.

3. A magnetic thin film structure in accordance with claim 2 wherein said Mn gamma phase alloys are binary, ternary, and higher level alloys with elements selected from the group consisting of Fe, Co, Cu, Ge, Ni, Pt, and Rh with Mn.

4. A magnetic thin film structure in accordance with claim 1 wherein a third layer of a nonmagnetic material is provided in contact with said first and second layers, a fourth layer of a ferromagnetic material and a fifth layer of an antiferromagnetic material are in direct atomic contact with each other, said fourth and fifth layers being on the opposite side of said third layer, said fifth layer having a unidirectional bias direction sustained by an exchange interaction relationship with said fourth layer provided by alignment of spins in said antiferromagnetic material.

5. A structure in accordance with claim 4 wherein said antiferromagnetic material has a Neel temperature above the operating temperature of said structure selected from the group consisting of Mn gamma phase alloys stable at room temperature in the gamma phase (face centered cubic) and antiferromagnetic oxide including $\alpha Fe_2O_3$ and NiO.

6. A structure in accordance with claim 5 wherein said Mn gamma phase alloys are binary, ternary, and higher level alloys with elements selected from the group consisting of Fe, Co, Cu, Ge, Ni, Pt, and Rh with Mn.

7. A magnetic thin film structure in accordance with claim 4 wherein said structure comprises a magnetic transducer and said nonmagnetic material includes a conductor which forms an inductive thin film magnetic sensor.

8. A transducer in accordance with claim 7 wherein said antiferromagnetic material has a Neel temperature above the operating temperature of said transducer selected from the group consisting of Mn gamma phase alloys stable at room temperature in the gamma phase (face-centered cubic) and antiferromagnetic oxide including $\alpha Fe_2O_3$ and NiO.

9. A transducer in accordance with claim 8 wherein said Mn gamma phase alloys are binary, ternary, and higher level alloys with elements selected from the group consisting of Fe, Co, Cu, Ge, Ni, Pt, and Rh with Mn.

10. Apparatus in accordance with claim 7 wherein said transducer comprises a portion of a magnetic recording head.

11. A magnetic thin film structure in accordance with claim 1 wherein said second layer is a separate, homogeneous layer having a substantial thickness as distinguished from an antiferromagnetic layer formed by diffusion.

12. A magentic thin film structure in accordance with claim 1 wherein said second layer is a vacuum deposited thin antiferromagnetic layer deposited while a magnetic field is applied to said first layer to provide said unidirectional anisotropy.

13. A structure in accordance with claim 12 wherein said antiferromagnetic material has a Neel temperature above the operating temperature of said structure selected from the group consisting of Mn gamma phase alloys stable at room temperature in the gamma phase (face-centered cubic) and antiferromagnetic oxide including $\alpha Fe_2O_3$ and NiO.

14. A structure in accordance with claim 13 wherein said Mn gamma phase alloys are binary, ternary, and higher level alloys with elements selected from the group consisting of Fe, Co, Cu, Ge, Ni, Pt, and Rh with Mn.

15. A magnetoresistive thin film sensor in accordance with claim 12 wherein said second layer has a second surface on the opposite side thereof from said first layer,
   a thin film of nonmagnetic material contacting said second surface, and
   a thin film of ferromagnetic biasing material in direct contact with said nonmagnetic thin film on the opposite side thereof from said second surface.

16. A magnetoresistive sensor in accordance with claim 15 wherein said magnetoresistive sensor comprises a portion of a magnetic recording head.

17. A magnetoresistive thin film transducer in accordance with claim 12 wherein said first layer is an elongated narrow magnetoresistive sensor stripe, and said unidirectional magnetic bias has a substantial component along the length of said magnetoresistive sensor stripe.

18. A magnetoresistive thin film transducer in accordance with claim 17 wherein said second layer has a second surface on the side thereof opposite from said first layer, including
   a ferromagnetic thin film of low coercivity, highly permeable material in intimate exchange biasing relationship with said second surface of said second layer, with a unidirectional, magnetic anisotropy in said ferromagnetic film whereby an exchange coupled bias field is provided from said ferromagnetic thin film to said first film in a direction having a substantial component normal to the length of said elongated sensor stripe in said first layer.

19. A magnetoresistive thin film sensor in accordance with claim 18 wherein said magnetoresistive sensor comprises a portion of a magnetic recording head.

20. A transducer in accordance with claim 18 wherein said antiferromagnetic material has a Neel temperature above the operating temperature of said transducer selected from the group consisting of Mn gamma phase alloys stable at room temperature in the gamma phase (face-centered cubic) and antiferromagnetic oxide including $\alpha Fe_2O_3$ and NiO.

21. A transducer in accordance with claim 20 wherein said Mn gamma phase alloys are binary, ternary, and higher level alloys with elements selected from the group consisting of Fe, Co, Cu, Ge, Ni, Pt, and Rh with Mn.

22. A transducer in accordance with claim 21 wherein said antiferromagnetic material has a Neel temperature above the operating temperature of said transducer selected from the group consisting of Mn gamma phase alloys stable at room temperature in the gamma phase (face-centered cubic) and antiferromagnetic oxide including $\alpha Fe_2O_3$ and NiO.

23. A magnetoresistive transducer in accordance with claim 17 wherein a barber pole shorting metallization structure is deposited adjacent to and along the length of said stripe.

24. A transducer in accordance with claim 23 wherein said antiferromagnetic material has a Neel temperature above the operating temperature of said transducer selected from the group consisting of Mn gamma phase alloys stable at room temperature in the gamma phase (face-centered cubic) and antiferromagnetic oxide including $\alpha Fe_2O_3$ and NiO.

25. A transducer in accordance with claim 24 wherein said Mn gamma phase alloys are binary, ternary, and higher level alloys with elements selected from the group consisting of Fe, Co, Cu, Ge, Ni, Pt, and Rh with Mn.

26. A magnetic thin film structure in accordance with claim 1 wherein a third layer of a nonmagnetic material is provided in contact with said second layer, and a fourth layer of a low coercivity, high permeability ferromagnetic material is in contact with the opposite surface of said third layer having a magnetic characteristic accommodating return magnetic flux linkage from said first layer.

27. A thin film in accordance with claim 26 wherein a fifth layer of a nonmagnetic material is in contact with the opposite surface of said fourth layer, a sixth thin layer film of a ferromagnetic material in contact with said fifth layer and in direct atomic contact with a seventh layer of an antiferromagnetic material, said sixth layer having a coercivity less than about 10 Oersteds and a unidirectional magnetic bias sustained by an exchange interaction relationship with said seventh layer provided by alignment of spins in said antiferromagnetic material and an exchange coupling field $H_e$ greater than the coercivity $H_c$ in the presence of said exchange interaction.

28. A transducer in accordance with claim 27 wherein said antiferromagnetic material has a Neel temperature above the operating temperature of said transducer selected from the group consisting of Mn gamma phase alloys stable at room temperature in the gamma phase (face-centered cubic) and antiferromagnetic oxide including $\alpha Fe_2O_3$ and NiO.

29. A transducer in accordance with claim 28 wherein said Mn gamma phase alloys are binary, ternary, and higher level alloys with elements selected from the group consisting of Fe, Co, Cu, Ge, Ni, Pt, and Rh with Mn.

30. A transducer in accordance with claim 29 wherein said Mn gamma phase alloys are binary, ternary, and higher level alloys with elements selected from the group consisting of Fe, Co, Cu, Ge, Ni, Pt, and Rh with Mn.

31. A magnetic thin film structure including a sandwich composed of a plurality of layers including
a first pair of layers including a layer of soft magnetic material in direct contact with a layer of antiferromagnetic material wherein said soft material has a unidirectional soft bias direction sustained by an exchange interaction relationship with said antiferromagnetic material,
an intermediate layer of a nonmagnetic material,
a second pair of layers including a second layer of a soft magnetic material in direct contact with a second layer of antiferromagnetic material wherein said second layer of soft material has a unidirectional soft bias direction opposite to said first direction sustained by an exchange interaction relationship with second layer of antiferromagnetic material.

32. A magnetic structure in accordance with claim 31 wherein said sandwich comprises a portion of a thin film magnetic recording head.

33. A magnetic thin film transducer including a sandwich composed of a plurality of layers including
a first pair of layers including a layer of soft magnetic material in direct contact with a layer of antiferromagnetic material wherein said soft material has a unidirectional soft bias direction sustained by an exchange interaction relationship with said antiferromagnetic material,
a second layer of a soft magnetic material having a unidirectional soft bias direction sustained by an exchange interaction relationship with said antiferromagnetic material.

34. A thin film transducer in accordance with claim 33 wherein said transducer comprises a portion of a magnetic recording head.

35. A magnetic thin film transducer including a sandwich composed of a plurality of layers including
a first pair of layers including a layer of soft magnetic material in direct contact with a layer of antiferromagnetic material wherein said soft material has a unidirectional soft bias direction sustained by an exchange interaction relationship with said antiferromagnetic material,
a gap including an intermediate layer of nonmagnetic conductive sensor material,
a second pair of layers including a second layer of a soft magnetic material in direct contact with a second layer of antiferromagnetic material wherein said second layer of soft material has a unidirectional soft bias direction sustained by an exchange interaction relationship with said second layer of antiferromagnetic material.

36. A thin film transducer in accordance with claim 35 wherein said transducer comprises a portion of a magnetic recording head.

37. A magnetic thin film transducer including a sandwich composed of a plurality of layers including
a first pair of layers including a layer of soft magnetic material in direct contact with a layer of antiferromagnetic material wherein said soft material has a unidirectional soft bias direction sustained by an exchange interaction relationship with said antiferromagnetic material,
an intermediate layer of nonmagnetic material, and a second layer of a soft magnetic material wherein said second layer of soft material has a soft bias direction sustained by coupling of flux with said first pair of layers.

38. A thin film transducer in accordance with claim 37 wherein said transducer comprises a portion of a magnetic recording head.

39. A magnetic thin film structure including a sandwich composed of a plurality of layers including
   a first pair of layers including a layer of soft magnetic material in direct contact with a layer of antiferromagnetic material wherein said soft material has a unidirectional soft bias direction sustained by an exchange interaction relationship with said antiferromagnetic material,
   an intermediate layer of a nonmagnetic material, and
   a second layer of a soft magnetic material wherein said second layer of soft material has a unidirectional soft bias direction sustained by coupling of flux with said first pair of layers.

40. A method of forming a magnetic thin film structure comprising depositing a first film of a low coercivity, highly permeable ferromagnetic material upon a substrate, and depositing a second film of an antiferromagnetic material in direct atomic contact with said first film while maintaining a magnetic field upon said first film.

41. A method in accordance with claim 40 wherein said antiferromagnetic material has a Neel temperature above the operating temperature of said structure selected from the group consisting of Mn gamma phase alloys stable at room temperature in the gamma phase (face-centered cubic) and antiferromagnetic oxide including $\alpha Fe_2O_3$ and NiO.

42. A method in accordance with claim 41 wherein said Mn gamma phase alloys are binary, ternary, and higher level alloys with elements selected from the group consisting of Fe, Co, Cu, Ge, Ni, Pt, and Rh with Mn.

43. A method of forming a magnetic thin film structure comprising
   depositing a pair of films upon a substrate,
   with a first one of said films comprising a ferromagnetic material with a low coercivity below 10 Oersteds of highly permeable material upon a substrate, and
   a second one of said films comprising an antiferromagnetic material,
   said films being in direct atomic contact with each other, and
   subsequently heating said films above the ordering temperature while maintaining a unidirectional magnetic field applied to said films during cooling thereof producing an exchange interaction relationship between said films with alignment of spins in said antiferromagnetic material and an exchange coupling field $H_e$ greater than the coercivity in the presence of said exchange interaction while retaining low coercivity below 10 Oersteds in said first film.

44. A method in accordance with claim 43 wherein said antiferromagnetic material has a Neel temperature above the operating temperature of said structure selected from the group consisting of Mn gamma phase alloys stable at room temperature in the gamma phase (face-centered cubic) and antiferromagnetic oxide including $\alpha Fe_2O_3$ and NiO.

45. A method in accordance with claim 44 wherein said Mn gamma phase alloys are binary, ternary, and higher level alloys with elements selected from the group consisting of Fe, Co, Cu, Ge, Ni, Pt, and Rh with Mn.

46. A method of forming a magnetic thin film structure comprising
   depositing a pair of films upon a substrate with a first film being a ferromagnetic material with a low coercivity below 10 Oersteds, with a high permeability and the second film being an antiferromagnetic material, said first and second films being deposited in direct atomic contact with each other,
   and aligning the spins of said antiferromagnetic material to provide a unidirectional anisotropy in said first film by means of an exchange interaction relationship.

47. A method in accordance with claim 46 wherein said structure is a thin film magnetic recording head.

48. A method in accordance with claim 46 wherein said antiferromagnetic material has a Neel temperature above the operating temperature of said structure selected from the group consisting of Mn gamma phase alloys stable at room temperature in the gamma phase (face-centered cubic) and antiferromagnetic oxide including $\alpha Fe_2O_3$ and NiO.

49. A method in accordance with claim 48 wherein said Mn gamma phase alloys are binary, ternary, and higher level alloys with elements selected from the group consisting of Fe, Co, Cu, Ge, Ni, Pt, and Rh with Mn.

50. A composition of matter comprising a first material having a low coercivity of less than 10 Oersteds in direct atomic contact with a second material which is antiferromagnetic, with an exchange interaction relationship between said materials provided by alignment of spins in said antiferromagnetic material, and an exchange coupling field $H_e$ greater than the coercivity $H_c$ in the presence of said exchange interaction.

51. A composition of matter in accordance with claim 50 wherein said antiferromagnetic material has a Neel temperature above the operating temperature of said material selected from the group consisting of Mn gamma phase alloys stable at room temperature in the gamma phase (face-centerec cubic) and antiferromagnetic oxide including $\alpha Fe_2O_3$ and NiO.

52. A composition of matter in accordance with claim 51 wherein said Mn gamma phase alloys are binary, ternary, and higher level alloys with elements selected from the group consisting of Fe, Co, Cu, Ge, Ni, Pt, and Rh with Mn.

53. A magnetic thin film transducer including a sandwich composed of a plurality of layers including
   a first pair of layers including a layer of soft magnetic material in direct contact with a layer of antiferromagnetic material wherein said soft material has a unidirectional soft bias direction sustained by an exchange interaction relationship with said antiferromagnetic material,
   a nonmagnetic layer deposited upon said first pair of layers,
   a second pair of layers including a second layer of a soft magnetic material in direct contact with a second layer of antiferromagnetic material wherein said soft material has a unidirectional soft bias direction sustained by an exchange interaction relationship with said second layer of antiferromagnetic material.

* * * * *